United States Patent [19]

Rieger et al.

[11] 4,163,948
[45] Aug. 7, 1979

[54] FILTER FOR DIGITAL-TO-ANALOG CONVERTER

[75] Inventors: Michael L. Rieger, Tigard; Martin D. Singer, Beaverton, both of Oreg.

[73] Assignee: Tektronix, Inc., Beaverton, Oreg.

[21] Appl. No.: 900,557

[22] Filed: Apr. 27, 1978

Related U.S. Application Data

[63] Continuation of Ser. No. 786,166, Apr. 11, 1977, abandoned.

[51] Int. Cl.² .............................................. H03K 5/08
[52] U.S. Cl. .................................... 328/167; 307/230; 307/237; 330/260; 330/302
[58] Field of Search ................... 307/230, 233 R, 237; 328/167; 330/257, 260, 302

[56] References Cited

U.S. PATENT DOCUMENTS

| | | | |
|---|---|---|---|
| 3,736,517 | 5/1973 | Lim | 328/167 |
| 3,761,787 | 9/1973 | Davis et al. | 330/257 X |
| 3,772,604 | 11/1973 | Hogg et al. | 307/230 X |
| 3,786,363 | 1/1974 | Lelie | 330/302 |
| 3,824,496 | 7/1974 | Hekimian | 307/230 X |
| 3,904,978 | 9/1975 | Daniels et al. | 328/167 |

Primary Examiner—John S. Heyman
Attorney, Agent, or Firm—Adrian J. LaRue; William D. Haffner

[57] ABSTRACT

A circuit for attenuating undesired electrical aberrations associated with digital-to-analog converters is provided. Specifically, the circuit is a non-linear filter for attenuating undesired false or spurious electronic signals superimposed on the output waveform of a digital-to-analog converter when the digital word input signal is changed.

6 Claims, 7 Drawing Figures

FILTER FOR DIGITAL-TO-ANALOG CONVERTER

This is a continuation, of application Ser. No. 786,166 filed Apr. 11, 1977 now abandoned.

BACKGROUND OF THE INVENTION

As is well known, several known systems receive a digital word as an input signal and converts such signal to an analog current or analog voltage. Generally, these systems are known as digital-to-analog converters or DAC's. The analog output, however, contains false or spurious electronic signals caused by unequal propagation delays among the bits arriving at the input of the DAC or by variations in the transient responses of the binary weighted elements within the DAC or by a combination of both.

Known prior art for attenuating these undesired spurious signals has been to utilize conventional low pass linear filters. These filters can be used to make the output waveform smoother, but the spurious signals are not really eliminated. Rather, the energy within the spurious signals is only redistributed. In addition to low pass linear filters, the prior art also uses sample and hold circuits when the transition frequencies are low. These type circuits are quite expensive and complicated, but do attenuate the electrical aberrations.

SUMMARY OF INVENTION

The present invention overcomes the above-described problems associated with attenuating undesired electrical aberrations by providing a non-linear filter which provides a high small-signal, bandwidth amplifier which is slew-rate limited. The derivative of the output is constrained within specific limits, while the small-signal bandwidth of a signal within such limits is high.

It is therefore an object of the present invention to provide a filter for a digital-to-analog converter which overcomes the disadvantages of the prior art.

It is another object of the present invention to provide a non-linear filter for attenuating undesired false or spurious electronic signals.

it is yet another object of the present invention to provide a non-linear filter for attenuating undesired false or spurious electronic signals superimposed on the output waveforms of digital-to-analog converters.

It is still yet another object of the present invention to provide a non-linear filter having a high small-signal bandwidth amplifier which is slew-rate limited.

The subject matter of the present invention is particularly pointed out and distinctly claimed in the concluding portion of this specification. The invention, however, both as to organization and method of operation, together with further advantages and objects thereof, may best be understood by reference to the following description taken in connection with the accompanying drawings.

DESCRIPTION OF THE INVENTION

Figure 1:
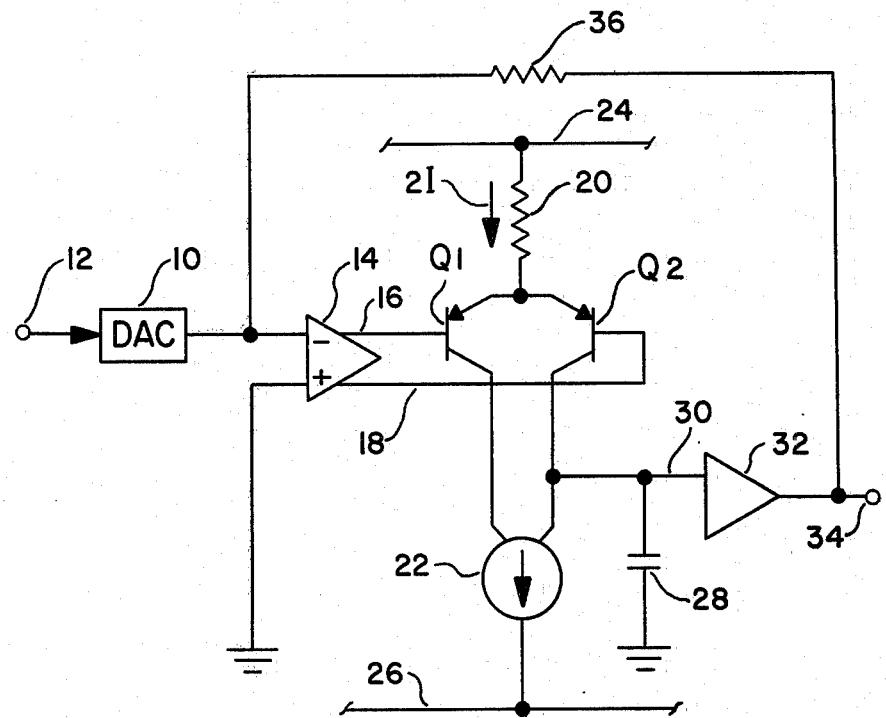
FIG. 1 is a hybrid block and circuit diagram of the filter for attenuating undesired electrical aberrations in accordance with the present invention.
Figure 2:
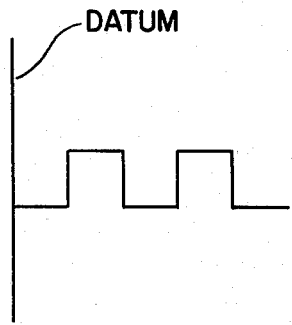
FIG. 2 is a graph of a typical input signal or data word which is to be converted to an analog signal.

Referring to FIG. 1, in accordance with the present invention, a digital-to-analog converter, DAC 10, as known from the prior art is connected to an input terminal 12. Applied to input terminal 12 is a digital word such as the input signal shown in FIG. 2. Accordingly, DAC 10 represents a typical digital-to-analog converter for translating or converting the digital word input signal to an analog waveform; the analog waveform being a current waveform in the embodiment shown. It should be understood, however, that DAC 10 may be of the multiplying type. As DAC 10 is of conventional design, no detailed discussion thereof is believed necessary. However, for those who desire more information on digital-to-analog converters, see "Integrated Electronics Analog and Digital Circuits and Systems" by Millman and Halkias, copyright 1972 by McGraw-Hill, Inc.

Figure 3:
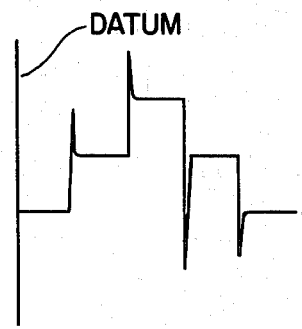
FIG. 3 is a graph of a typical output analog signal obtained from a digital-to-analog converter.

The output of DAC 10 may be the waveform shown in FIG. 3. This typical waveform is, say, a step waveform converted from the input digital word shown in FIG. 2. This DAC output waveform contains electrical spikes or pulses whenever the input digital word is changed. The spikes, again, are normally caused by unequal propagation delays among the bits arriving at the input, or are caused by variations in the transient response of the binary weighted elements within the digital-to-analog converter, or are caused by a combination of both. (See "Computer Logic Design" by M. Mano, copyright 1972 by Prentice-Hall, Inc. for definitions and understanding of "bits" and "binary weighted elements.")

The output of DAC 10 is applied to the inverting input ($-$) of an amplifier 14 having two output lines 16 and 18. Amplifier 14 has a noninverting input ($+$) coupled to ground.

Output lines 16 and 18 are used to drive the bases of a pair of emitter coupled PNP transistors Q1 and Q2, respectively. This differential transistor pair is biased such that a common emitter current 2I flows through an emitter resistor 20 as indicated in the drawing. The collector of transistor Q1 as well as the collector of ransistor Q2 is coupled to a current mirror 22. As connected, the transistors Q1 and Q2 may have a collector current that ranges from 0 to 2I. It should be mentioned that the resistor 20 and current sink 22 are also coupled to operating potentials which are provided on power supply bus lines 24 and 26 respectively.

A capacitor 28 has one terminal thereof grounded whereas the other terminal is coupled to a common line 30 which is disposed between a junction formed by the connection of the collector of transistor Q2 and the current mirror 22, and the input of a buffer amplifier 32. As connected, the capacitor 28 has available current that ranges from $-2I$ to $+2I$, and the terminal voltage of capacitor 28 changes at a rate limited by $\pm 2I/C$ volts/sec. Buffer amplifier 32 presents a high impedance to the capacitor and produces a low impedance output at output terminal 34.

Figure 4:
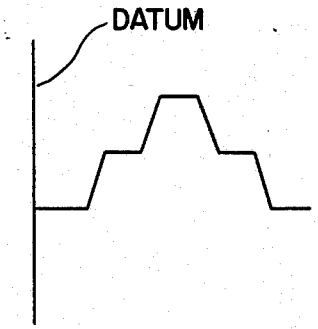
FIG. 4 is a graph of the output signal obtained after filtering in accordance with the present invention.

The circuit is completed or closed through a feedback means such as the resistor 36 disposed between the inverting (−) input of the amplifier 14 and the output terminal 34. The feedback means is, of course, utilized to determine the amplitude of the output signal which may be, for example, the waveform shown in FIG. 4.

Basically, the principle of the circuit according to the present invention is to operate as a non-linear filter to provide a high small-signal bandwidth amplifier which is slew-rate limited. The derivative of the output is contrained within specific limits, while the small-signal bandwidth of the output signal within such limits is high. The slew-rate must, of course, be higher than the maximum desired rate of change of the output signal.

Figure 5:
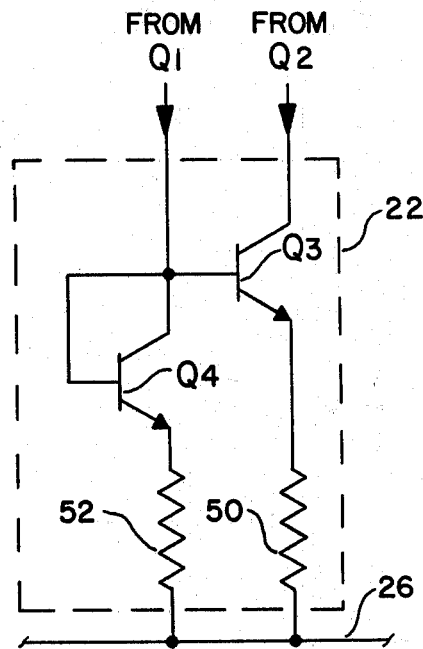
FIG. 5 is a schematic diagram of a conventional current source used in the FIG. 1 embodiment.

Reference should now be made to FIG. 5 wherein is shown current mirror 22 in detailed form. The mirror comprises an NPN transistor Q3 whose collector is directly coupled to the collector of transistor Q2 and whose emitter is coupled to the bus 26 via emitter resistor 50. The base of transistor Q3 is biased and stabilized, and made to operate as a current mirror arrangement in a conventional manner via the series connected network comprising resistor 52 and diode connected transistor Q4 disposed between the collector of transistor Q1 and bus 26. (See U.S. Pat. No. 3,939,434 for alternative current mirror.)

Figure 6:
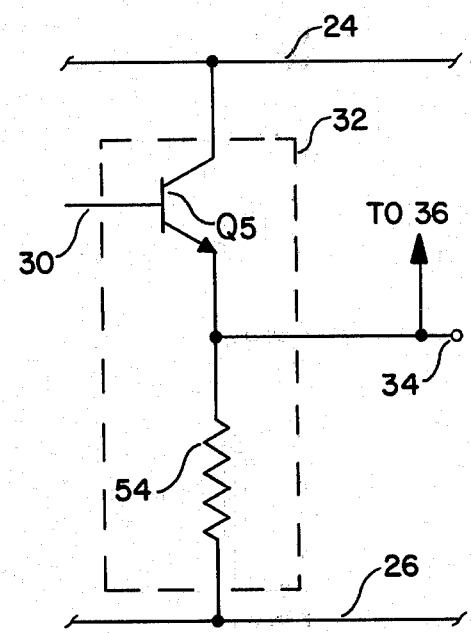
FIG. 6 is a schematic diagram of a conventional buffer amplifier used in the FIG. 1 embodiment.

In FIG. 6 there is shown the buffer amplifier 32. As can be discerned, amplifier 32 comprises an emitter follower NPN transistor Q5 whose collector is coupled, and usually bypassed, to bus 24 whereas its emitter is coupled to the bus 26 via emitter resistor 54. The base is, of course, coupled to the line 30.

Before considering the operation of the overall circuit in detail, while the applicants do not wish to be limited to any particular set of values, the following values have proved useful in one embodiment of the subject invention:

| | |
|---|---|
| Amplifier 14 | Fairchild 733C |
| Resistor 20 | 2.1KΩ, ⅛ Watt, 1% |
| Capacitor 28 | 0.068 ufd, ceramic 50V |
| Resistor 36 | 2.0KΩ, ⅛ Watt, 1% |
| Q1, Q2 | Motorola MPS-H81 |
| Q3, Q4, Q5 | 2N4124 |
| Resistors 50, 52 | 1.07KΩ, ⅛ Watt, 1% |
| Resistor 54 | 1.5KΩ, ⅛ Watt, 1% |
| Power Supply Bus 24 | +15 Volts |
| Power Supply Bus 26 | −15 Volts |

These above-listed values provide a slew rate of about $0.515 \times 10^4$ volt/sec or 194 μsec/volt as hereinafter shown. Assume that 2I equals 3.5 mA and that the voltage changes by 10 volts so that:

$$\frac{dv}{dt}(10V) = \frac{2I}{C} \text{ volt/sec}$$

$$\frac{dv}{dt}(10) = \frac{3.5 \times 10^{-3}}{0.068 \times 10^{-6}} \text{ volt/sec}$$

$$\frac{dv}{dt}(10) = 5.15 \times 10^4 \text{ volt/sec.}$$

Normalizing, $$\frac{dv}{dt}(1V) = \frac{5.15 \times 10^4}{10} \text{ volt/sec}$$

$$\frac{dv}{dt}(1V) = 0.515 \times 10^4 \text{ volt/sec or}$$

by taking the reciprocals, about 194 μsec/volt.

Operation of the filter in accordance with the subject drawings of the present invention will now be considered. Basically, the output of DAC 10 is coupled via amplifier 14 wherein it is treated to the advantages of high-gain amplification and converted to a double-ended signal. The amplifier must, of course, provide a high gain since the overall filter is an operational amplifier with feedback.

The double-ended output signal then drives the transistor pair Q1, Q2 operating as a current switch for steering current into or away from the capacitor 28. The terminal voltage across the capacitor, due to the current therein, is then applied via buffer amplifier 32 to the output terminal 34. As has been previously stated, buffer amplifier 32 provides a high impedance for capacitor 28 and a low impedance to the output.

Figure 7:
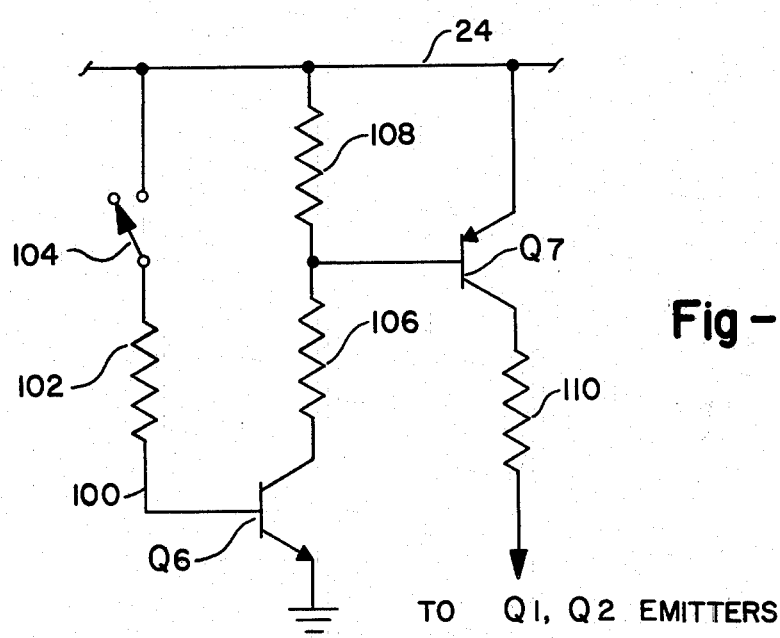
FIG. 7 is a schematic diagram of an additional circuit which may be used with the FIG. 1 embodiment to change the characteristics of the filter.

While there has been shown and described one preferred embodiment of the present invention, it will be apparent to those skilled in the art that many changes and modifications may be made without departing therefrom in its broader aspects. For example, it may be advantageous to increase the slew rate properties of the filter. Accordingly, in FIG. 7 there is shown an additional circuit for accomplishing this task.

As shown, the additional circuit comprises a grounded emitter NPN transistor switch Q6 whose base may be controlled remotely via a line 100. Connected to line 100 may be, for example, a series connected resistor 102 and a two position switch 104. With the switch 104 in the position shown, transistor Q6 is non-conducting. Consequently, there will be no collector current flowing through load resistors 106 and 108 disposed between bus 24 and the collector of transistor Q6. Consequently, a transistor Q7, which is preferably of the PNP type and whose emitter-base junction is disposed in parallel with the resistor 108, is also non-conductive.

However, when switch 104 is switched into a second position, which connects resistor 102 to the bus 24, transistor Q6 turns on. As a result of current through load resistors 106 and 108, transistors Q7 becomes conductive. Collector current of Q7 is therefore available via load resistor 110 for application to the emitters of the already mentioned transistors Q1 and Q2. This additional current, along with the current 2I causes capacitor 28 to be charged and discharged at a much faster rate to thereby increase the slew rate.

Again, applicants hereinafter list a set of values which have proved useful in one embodiment of the additional circuit which will change the filter slew rate to about 68 μsec/volt, but do not wish to be limited thereto:

| | |
|---|---|
| Q6 | 2N3904 |
| Q7 | 2N3906 |
| R102 | 39KΩ, ¼ Watt, 5% |
| R106 | 47KΩ, ¼ Watt, 5% |
| R108 | 100KΩ, ¼ Watt, 5 % |
| R110 | 1KΩ, ⅛ Watt, 1% |

It should also be mentioned that in the FIG. 1 embodiment, the amplifier 14 requires power supply connections which are usually bypassed and also requires that a resistor be disposed between each output line and ground for properly interfacing with the transistors Q1 and Q2. Additionally, the grounded input of amplifier 14 may be grounded by way of an impedance means such as, for example, a parallel RC network. These above discussed connections have not been shown as they are believed to be well known techniques.

Therefore, the appended claims are intended to cover all changes and modifications as fall within the true spirit and scope of the invention.

The invention is claimed in accordance with the following:

1. A non-linear filter for attenuating spurious electronic signals, the filter comprising:
    circuit input means for receiving the signals to be attenuated;
    first amplifier means coupled to said circuit input means for amplifying the signals to be attenuated and including means for providing the amplified signals as double-ended signals;
    second amplifier means coupled to receive said double-ended signals for providing a single ended output signal, said second amplifier means including constant current source means for providing a constant current;
    current mirror means coupled to receive said single-ended output signal for sinking said constant current;
    a capacitor coupled to receive at least a portion of said constant current for producing a terminal voltage thereacross in accordance with said constant current received;
    buffer amplifier means responsive to said terminal voltage for applying said terminal voltage to a circuit output means; and
    feedback means coupled between said circuit input means and said circuit output means for feeding at least a portion of said terminal voltage to said first amplifier means for controlling the amplitude of said terminal voltage.

2. The filter according to claim 1 further comprising additional circuit means for providing an additional constant current for said second amplifier means.

3. A non-linear filter for attenuating spurious electronic signals, the filter comprising:
    means for receiving the signal to be attenuated;
    a first amplifier coupled to said signal receiving means for amplifying the signals to be attenuated and including means for providing the amplified signals as double-ended signals;
    a second amplifier coupled to said first amplifier and to receive said double-ended signals for providing a single-ended output signal, said second amplifier including a constant current source for providing a constant current;
    storage means coupled to said second amplifier and to receive at least a portion of said constant current for producing a terminal voltage thereacross in accordance with said constant current received;
    means for providing an output signal coupled to said storage means and to said second amplifier; and
    means for providing feedback between said signal receiving means and said output means for controlling the amplitude of said terminal voltage.

4. The filter according to claim 3 further comprising a current sink for receiving said single-ended output signal for sinking said constant current.

5. The filter according to claim 4 wherein said current sink comprises a current mirror.

6. The filter according to claim 3 further comprising a buffer amplifier for applying said terminal voltage to said output means.

* * * * *